US008999746B2

(12) United States Patent
Yamanouchi et al.

(10) Patent No.: US 8,999,746 B2
(45) Date of Patent: Apr. 7, 2015

(54) METHOD OF FORMING METAL CHALCOGENIDE DISPERSION, METAL CHALCOGENIDE DISPERSION, METHOD OF PRODUCING LIGHT ABSORBING LAYER OF SOLAR CELL, METHOD OF PRODUCING SOLAR CELL

(71) Applicant: Tokyo Ohka Kogyo Co., Ltd., Kawasaki-shi (JP)

(72) Inventors: Atsushi Yamanouchi, Kawasaki (JP); Koichi Misumi, Hillsboro, OR (US); Akimasa Nakamura, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/962,631

(22) Filed: Aug. 8, 2013

(65) Prior Publication Data
US 2015/0044813 A1 Feb. 12, 2015

(51) Int. Cl.
*H01L 21/02* (2006.01)
*H01L 31/0749* (2012.01)
(Continued)

(52) U.S. Cl.
CPC ............ *H01L 31/18* (2013.01); *H01L 31/0256* (2013.01); *H01L 2031/0344* (2013.01)

(58) Field of Classification Search
CPC ................. H01L 21/02568; H01L 21/02601; H01L 21/02628; H01L 31/0272; H01L 31/0256; H01L 31/0322; H01L 29/78681; H01L 29/66742; H01L 31/18; H01L 31/0326; H01L 31/0749; C01B 19/002; C01B 19/007; Y02E 10/541; C01G 15/00; C01G 3/00
USPC .......... 136/252, 264, 243, 262, 265; 252/582, 252/519.14, 519.3; 423/1, 111, 122, 508, 423/659; 429/111; 257/613; 438/95
See application file for complete search history.

(56) References Cited

U.S. PATENT DOCUMENTS 7,094,651 B2   8/2006 Mitzi et al.
7,517,718 B2 * 4/2009 Mitzi et al. ...................... 438/95
(Continued)

FOREIGN PATENT DOCUMENTS

EP      2 608 274 A1    6/2013
JP      A-2009-040640   2/2009
(Continued)

OTHER PUBLICATIONS

Office Action in U.S. Appl. No. 13/662,870, mailed Oct. 24, 2014.

*Primary Examiner* — Jarrett Stark
*Assistant Examiner* — Bitew Dinke
(74) *Attorney, Agent, or Firm* — Knobbe Martens Olson & Bear LLP

(57) ABSTRACT

A method of producing a metal chalcogenide dispersion usable in forming a light absorbing layer of a solar cell, the method including: a metal chalcogenide nano particle formation step in which at least one metal or metal compound selected from the group consisting of a group 11, 12, 13, 14 or 15 metal or metal compound, a water-containing solvent and a group 16 element-containing compound are mixed together to obtain metal chalcogenide nano particles; and an addition step in which a compound (1) represented by general formula (1) is added to the metal chalcogenide nano particles, thereby obtaining a metal chalcogenide dispersion (wherein $R^1$ to $R^4$ each independently represents an alkyl group, an aryl group or a hydrogen atom; provided that at least one of $R^1$ to $R^4$ represents a hydrocarbon group).

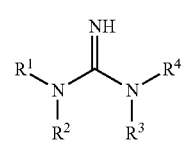

(1)

19 Claims, 1 Drawing Sheet

(51) Int. Cl.
*H01L 31/032* (2006.01)
*H01L 31/0272* (2006.01)
*H01L 31/18* (2006.01)
*H01L 31/0256* (2006.01)

(56) References Cited

U.S. PATENT DOCUMENTS

| | | | |
|---|---|---|---|
| 7,618,841 B2* | 11/2009 | Mitzi et al. | 438/95 |
| 8,268,270 B1* | 9/2012 | Kuwahara et al. | 423/111 |
| 8,324,800 B2* | 12/2012 | Royster et al. | 313/504 |
| 2003/0003043 A1* | 1/2003 | Ishida | 423/509 |
| 2004/0094197 A1* | 5/2004 | Andriessen et al. | 136/263 |
| 2004/0103936 A1* | 6/2004 | Andriessen | 136/252 |
| 2005/0052129 A1* | 3/2005 | Yamashita | 313/506 |
| 2008/0176986 A1 | 7/2008 | Burgard | |
| 2009/0214763 A1 | 8/2009 | Joo et al. | |
| 2011/0008927 A1 | 1/2011 | Huang et al. | |
| 2011/0076483 A1* | 3/2011 | Ryowa | 428/328 |
| 2011/0076798 A1 | 3/2011 | Calzia et al. | |
| 2011/0094557 A1 | 4/2011 | Mitzi et al. | |
| 2011/0120343 A1 | 5/2011 | Calzia et al. | |
| 2012/0288987 A1 | 11/2012 | Radu et al. | |
| 2012/0315210 A1* | 12/2012 | Kuwahara et al. | 423/413 |
| 2013/0037110 A1 | 2/2013 | Mitzi et al. | |
| 2013/0153033 A1* | 6/2013 | Zhang et al. | 136/264 |
| 2014/0072500 A1* | 3/2014 | Kuwahara et al. | 423/413 |
| 2014/0117293 A1* | 5/2014 | Kuwahara et al. | 252/582 |

FOREIGN PATENT DOCUMENTS

| | | |
|---|---|---|
| JP | A-2013-512311 | 4/2013 |
| WO | WO 2012/023519 A1 | 2/2012 |

* cited by examiner

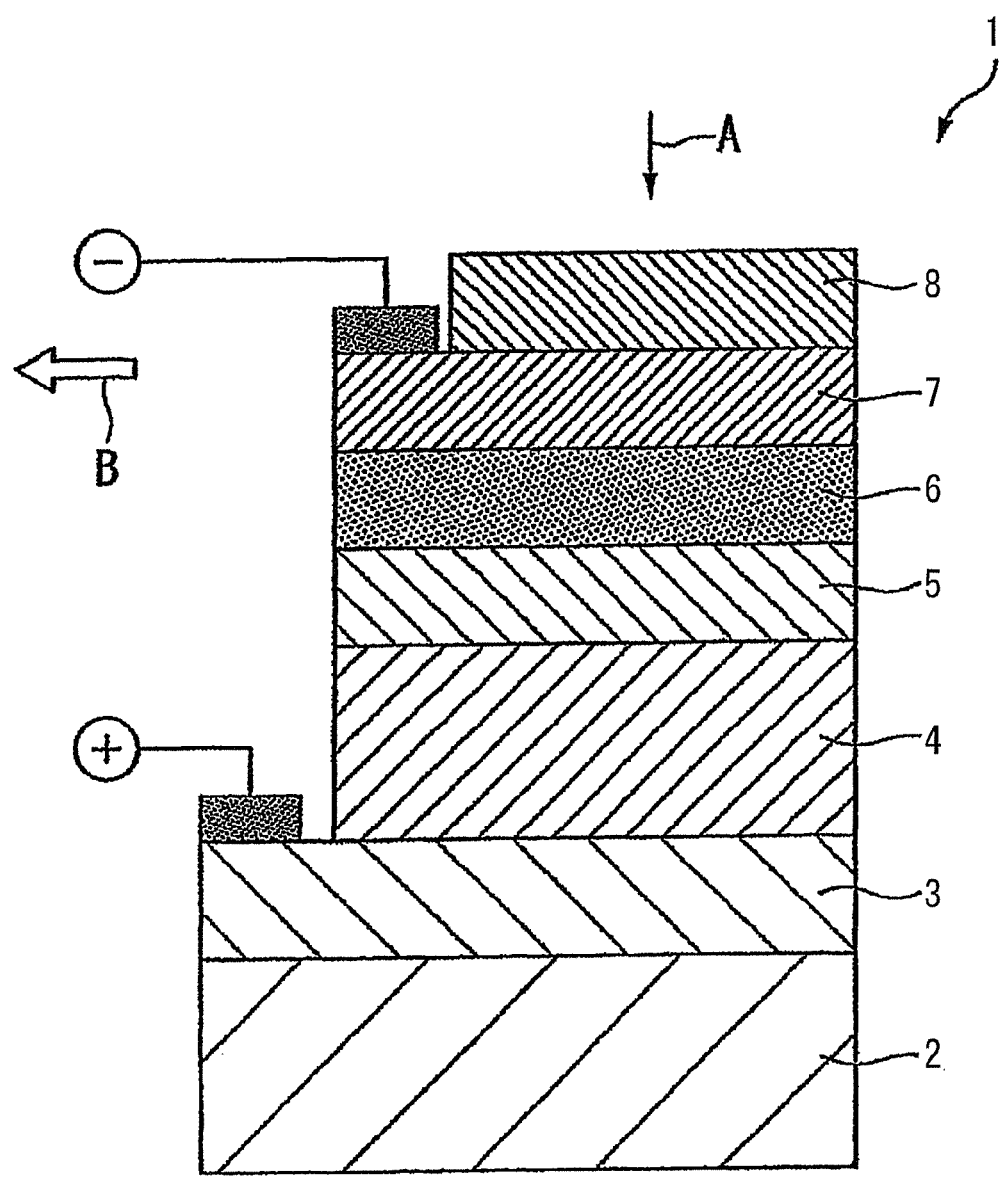

METHOD OF FORMING METAL CHALCOGENIDE DISPERSION, METAL CHALCOGENIDE DISPERSION, METHOD OF PRODUCING LIGHT ABSORBING LAYER OF SOLAR CELL, METHOD OF PRODUCING SOLAR CELL

TECHNICAL FIELD

The present invention relates to a method of producing a metal chalcogenide dispersion for forming a light-absorbing layer of a solar cell, the metal chalcogenide dispersion, a method of producing a light-absorbing layer of a solar cell using the metal chalcogenide dispersion, and a method of producing a solar cell using the metal chalcogenide dispersion.

DESCRIPTION OF RELATED ART

In recent years, in consideration of environment, solar cells have been attracting a growing interest. In particular, attention has been drawn to chalcopyrite solar cells which are thin-film solar cells with high photoelectric conversion efficiency, and also CZTS solar cells which have a rare metal such as indium used in a chalcopyrite solar cell substituted with another element, and hence, research and development have been actively conducted.

A chalcopyrite solar cell is produced by forming a light absorbing layer prepared from a chalcopyrite material on a substrate. Representative elements of a chalcopyrite material include copper (Cu), indium (In), gallium (Ga), selenium (Se) and sulfur (S), and representative examples of a light absorbing layer include $Cu(In, Ga)Se_2$ and $Cu(In, Ga)(Se, S)_2$, which are abbreviated as CIGS and CIGSS, respectively. Recently, CZTS solar cell has been studied in which a rare metal indium has been substituted and is composed of, for example, copper (Cu), zinc (Zn), tin (Sn), selenium (Se) and sulfur (S). Representative examples of the light absorbing layer of such a solar cell include $Cu_2ZnSnSe_4$, $Cu_2ZnSnS_4$ and $Cu_2ZnSn(S, Se)_4$.

FIG. 1 is a schematic cross-sectional diagram of an example of a chalcopyrite solar cell or a CZTS solar cell.

As shown in FIG. 1, a chalcopyrite solar cell or a CZTS solar cell 1 has a basic structure in which a first electrode 3, a CIGS or CZTS layer 4, a buffer layer 5, an i-ZnO layer 6 and a second electrode 7 are laminated on a substrate 2 in this order. As the buffer layer, for example, a CdS layer, an ZnS layer and an InS layer are known.

Each of the first electrode 3 and the second electrode 7 has a terminal connected thereto, and each of the terminals is connected to a wiring. In such a chalcopyrite solar cell or a CZTS solar cell 1, an incident light entering in the direction of A is absorbed by the CIGS or CZTS layer 4 to generate an electromotive force, and an electric current flows in the direction of B.

The surface of the second electrode 7 is, for example, covered with an anti-reflection film layer 8 composed of an $MgF_2$ layer for protection.

As a method of forming a CIGS or CZTS layer 4, a sputtering method and a coating method are known. However, in the sputtering method, the size of the apparatus tends to be scaled up, thereby deteriorating the yield. Therefore, diligent studies have been made on the coating method which enables production at a relatively low cost.

Generally, in a coating method of a CIGS layer, elements such as Cu, In, Ga, Se and S in the case of a CIGS layer and elements such as Cu, Zn, Sn, Se and S in the case of a CZTS layer are dispersed in a specific solvent to prepare a dispersion, and the dispersion is applied to a substrate by a spin coating method or a dipping method, followed by baking, thereby forming a CIGS layer or a CZTS layer.

As methods for preparing such a dispersion, there are known a method in which metal compound particles of the metal element and a binder are dispersed in an organic solvent; a method in which metal compound particles of the metal element are dispersed in water, followed by addition of Se or S and extraction to thereby disperse the particles again (see Patent Document 2); a method in which a group 13 material/organic complex is added to a polyamine solvent, followed by addition of a reducing agent (see Patent Document 3); and a method in which a selenium component, an organic chalcogenide and a liquid carrier are mixed (see Patent Document 4).

DOCUMENTS OF RELATED ART

Patent Document

[Patent Document 1] WO2012-023519
[Patent Document 2] U.S. Pre-grant Patent Publication No. 2013/0037110
[Patent Document 3] U.S. Pre-grant Patent Publication No. 2011/0120343
[Patent Document 3] U.S. Pre-grant Patent Publication No. 2011/0076798

SUMMARY OF THE INVENTION

However, a dispersion prepared by the conventional methods posed a problem that the secondary particle diameter could not be suppressed to no larger than 100 nm. Further, there was a problem that suppression of agglomeration with lapse of time was difficult, which resulted in increase of the liquid viscosity and precipitation of the particles, so that a stable coating solution could not be obtained.

In view of these problems, there have been demands for a method of producing a coating solution stably usable in forming a light-absorbing layer of a solar cell. However, such an effective, suitable method has not been proposed under these circumstances.

For solving the above-mentioned problems, the present invention employs the following embodiments.

Specifically, a first aspect of the present invention is a method of producing a metal chalcogenide dispersion usable in forming a light absorbing layer of a solar cell, the method including: a metal chalcogenide nano particle formation step in which at least one metal or metal compound selected from the group consisting of a group 11 metal, a group 12 metal, a group 13 metal, a group 14 metal, a group 15 metal, a group 11 metal compound, a group 12 metal compound, a group 13 metal compound, a group 14 metal compound and a group 15 metal compound, a solvent containing water as a main component, and a group 16 element-containing compound are mixed together to obtain metal chalcogenide nano particles; and an addition step in which a compound (1) represented by general formula (1) shown below is added to the metal chalcogenide nano particles, thereby obtaining a metal chalcogenide dispersion.

[Chemical Formula 1]

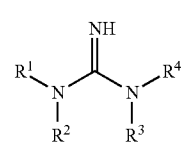

In the formula, $R^1$ to $R^4$ each independently represents an alkyl group, an aryl group or a hydrogen atom; provided that at least one of $R^1$ to $R^4$ represents an alkyl group or an aryl group; when $R^1$ and $R^2$ each independently represents an alkyl group or an aryl group, $R^1$ and $R^2$ may be mutually bonded to form a ring with the nitrogen atom; and when $R^3$ and $R^4$ each independently represents an alkyl group or an aryl group, $R^3$ and $R^4$ may be mutually bonded to form a ring with the nitrogen atom.

A second aspect of the present invention is a metal chalcogenide dispersion usable in forming a light absorbing layer of a solar cell, including: metal chalcogenide particles of at least one metal or metal compound selected from the group consisting of a group 11 metal, a group 12 metal, a group 13 metal, a group 14 metal, a group 15 metal, a group 11 metal compound, a group 12 metal compound, a group 13 metal compound, a group 14 metal compound and a group 15 metal compound; a solvent containing water as a main component; and a compound (1) represented by general formula (1) shown below.

[Chemical Formula 2]

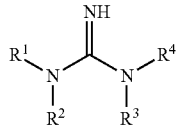

(1)

In the formula, $R^1$ to $R^4$ each independently represents an alkyl group, an aryl group or a hydrogen atom; provided that at least one of $R^1$ to $R^4$ represents an alkyl group or an aryl group; when $R^1$ and $R^2$ each independently represents an alkyl group or an aryl group, $R^1$ and $R^2$ may be mutually bonded to form a ring with the nitrogen atom; and when $R^3$ and $R^4$ each independently represents an alkyl group or an aryl group, $R^3$ and $R^4$ may be mutually bonded to form a ring with the nitrogen atom.

A third aspect of the present invention is a method of forming a light absorbing layer of a solar cell, the method including: applying a metal chalcogenide dispersion obtained by the method according to the first aspect to a base, followed by baking.

A fourth aspect of the present invention is a method of producing a solar cell, the method including: forming a first electrode on a substrate; applying a metal chalcogenide dispersion obtained by the method according to the first aspect to the first electrode, followed by baking to form a light absorbing layer; forming a buffer layer on the light absorbing layer; and forming a second electrode on the buffer layer.

According to the present invention, there is provided a method of producing a metal chalcogenide dispersion having a small average particle diameter and small change in the viscosity with lapse of time.

BRIEF DESCRIPTION OF THE DRAWINGS

FIG. 1 A schematic cross-sectional diagram of an example of a chalcopyrite solar cell or a CZTS solar cell.

DETAILED DESCRIPTION OF THE INVENTION

[Method of Producing Metal Chalcogenide Dispersion]

A first aspect of the present invention is a method of producing a metal chalcogenide dispersion usable in forming a light absorbing layer of a solar cell (hereafter, sometimes referred to simply as "production method of metal chalcogenide dispersion"), the method including: a metal chalcogenide nano particle formation step in which at least one metal or metal compound selected from the group consisting of a group 11 metal, a group 12 metal, a group 13 metal, a group 14 metal, a group 15 metal, a group 11 metal compound, a group 12 metal compound, a group 13 metal compound, a group 14 metal compound and a group 15 metal compound, a solvent containing water as a main component, and a group 16 element-containing compound are mixed together to obtain metal chalcogenide nano particles; and an addition step in which a compound (1) represented by general formula (1) shown below is added to the metal chalcogenide nano particles, thereby obtaining a metal chalcogenide dispersion.

[Chemical Formula 3]

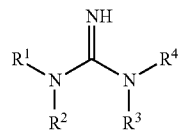

(1)

In the formula, $R^1$ to $R^4$ each independently represents an alkyl group, an aryl group or a hydrogen atom; provided that at least one of $R^1$ to $R^4$ represents an alkyl group or an aryl group; when $R^1$ and $R^2$ each independently represents an alkyl group or an aryl group, $R^1$ and $R^2$ may be mutually bonded to form a ring with the nitrogen atom; and when $R^3$ and $R^4$ each independently represents an alkyl group or an aryl group, $R^3$ and $R^4$ may be mutually bonded to form a ring with the nitrogen atom.

(Metal Chalcogenide Nano Particle Formation Step)

In the metal chalcogenide nano particle formation step, the at least one metal or metal compound, a solvent containing water as a main component and a group 16 element are mixed together to obtain metal chalcogenide nano particles.

Examples of the group 11 metal include Cu element and Ag element. Among these examples, Cu element is particularly desirable.

Examples of the group 12 metal include Zn element and Cd element. Among these examples, Zn element is particularly desirable.

Examples of the group 13 metal include Al element, Ga element and In element. Among these examples, Ga element and In element are particularly desirable.

Examples of the group 14 metal include Si element, Ge element and Sn element. Among these examples, Ge element and Sn element are particularly desirable.

Examples of the group 15 element include As element, Sb element and Bi element. Among these examples, Sb element is particularly desirable.

Examples of the group 11 metal compound include $Cu(OH)_2$, CuS, $Cu_2S$, $Cu_2Se$, CuSe, $Cu_2Te$, CuTe, CuO, $Cu_2O$, silver oxide, silver sulfide, silver selenide, aqueous inorganic salts such as copper (II) chloride and hydrates thereof, copper (II) bromide and hydrates thereof, copper (II) sulfate and hydrates thereof, copper nitrate (II) and hydrates thereof, and copper (II) tetrafluoroborate, and aqueous organic salts such as copper (II) acetate and hydrates thereof, copper (II) formate and hydrates thereof, and gluconic acid copper salt.

Examples of the group 12 metal compound include ZnO, zinc hydroxide, ZnS, ZnSe, ZnTe, aqueous inorganic salts such as zinc chloride and hydrates thereof, zinc bromide and hydrates thereof, zinc iodide and hydrates thereof, zinc sulfate and hydrates thereof, zinc nitrate and hydrates thereof, and aqueous organic salts such as zinc formate and hydrates thereof, zinc acetate and hydrates thereof, and gluconic acid copper salt.

Examples of the group 13 metal compound include In(OH)$_3$, indium oxide, indium sulfide, indium selenide, indium telluride, gallium oxide, gallium sulfide, gallium selenide, gallium telluride, indium chloride and hydrates thereof, indium bromide and hydrates thereof, indium iodide and hydrates thereof, indium nitrate and hydrates thereof, indium sulfate and hydrates thereof, gallium chloride and hydrates thereof, gallium bromide and hydrates thereof, gallium iodide and hydrates thereof, gallium nitrate and hydrates thereof, and gallium sulfate and hydrates thereof.

Examples of the group 14 metal compound include SnS, SnO, SnO$_2$, SnS$_2$, SnSe, SnSe$_2$, SnTe, germanium oxide, tin (IV) chloride, tin (II) chloride and hydrates thereof, tin (II) bromide and hydrates thereof, tin (II) iodide and hydrates thereof, germanium (IV) chloride, germanium (IV) bromide and germanium (IV) iodide.

Examples of the group 15 metal-containing compound include Sb$_2$O$_3$, arsenic acid, arsenous acid, antimony sulfide, antimony selenide and antimony telluride.

In the present invention, examples of the group 16 element contained in the group 16 element-containing compound include O, S, Se and Te. As the group 16 element, at least one member selected from the group consisting of S and Se is preferable, and Se is most preferable.

Examples of the group 16 element-containing compound include ammonium sulfide ((NH$_4$)$_2$S), ammonium selenide ((NH$_4$)$_2$Se), ammonium telluride ((NH$_4$)$_2$Te), hydrogen sulfide (H$_2$S), hydrogen selenide (H$_2$Se), hydrogen telluride (H$_2$Te), sodium sulfide (Na$_2$S), potassium sulfide (K$_2$S), selenium disulfide (SeS$_2$) and phosphorus pentasulfide (P$_2$S$_5$). Among these examples, ammonium sulfide ((NH$_4$)$_2$S), ammonium selenide ((NH$_4$)$_2$Se), hydrogen sulfide (H$_2$S) and hydrogen selenide (H$_2$Se) are preferable, ammonium sulfide ((NH$_4$)$_2$S) and ammonium selenide ((NH$_4$)$_2$Se) are more preferable, and ammonium sulfide ((NH$_4$)$_2$S) is most preferable.

As the group 16 element-containing compound, 1 kind of compound may be used, or 2 or more kinds of compounds may be used in combination.

In the present description and claims, a "solvent containing water as a main component" means a solvent containing at least 50% by weight of water. The solvent containing water as a main component preferably contains 70% by weight or more of water, and may contain 100% by weight of water.

The solvent containing water as a main component may contain 100% by weight of water, however, for adjusting the wettability on a substrate and drying property, the solvent may contain an organic solvent. As the organic solvent, at least one member selected from the group consisting of an alcohol such as methanol, ethanol or propanol, and an aprotic solvent such as dimethylsulfoxide or N,N-dimethylacetamide is preferable.

As the organic solvent, 1 kind of solvent may be used, or 2 or more kinds of solvents may be used in combination.

In the present invention, the method of mixing together the at least one metal or metal compound, the solvent containing water as a main component, and the group 16 element-containing compound is not particularly limited. Examples of the mixing method include a method in which all of the components are mixed together at once, and a method in which part of the components are added to the solvent and mixed together, followed by mixing the remaining components.

Further, a method in which the at least one metal or metal compound is mixed with an aqueous solution of the group 16 element-containing compound is also preferable.

By mixing together the at least one metal or metal compound, the solvent containing water as a main component, and the group 16 element-containing compound, metal chalcogenide nano particles are precipitated.

In the metal chalcogenide nano particle formation step, after mixing together the at least one metal or metal compound, a solvent containing water as a main component and a group 16 element-containing compound to obtain metal chalcogenide nano particles, the metal chalcogenide nano particles are preferably subjected to a dispersion treatment. By conducting a dispersion treatment, agglomerates of the metal chalcogenide nano particles can be dispersed, so that the particles can become closer to primary particles.

The dispersion treatment is not particularly limited, and examples thereof include an ultrasonic wave treatment, a homogenizer, a beads mill and a shear dispersion.

In the metal chalcogenide nano particle formation step, the metal chalcogenide nano particles which has been subjected to the dispersion treatment are preferably separated. By separating the metal chalcogenide nano particles, impurities such as reaction by-product and unreacted raw materials can be removed. The separation method is not particularly limited, and examples thereof include centrifugal separation, filtration and extraction.

In the metal chalcogenide nano particle formation step, the separated metal chalcogenide nano particles are preferably mixed with a solvent. As the solvent, the same solvent as those described above for the solvent containing water as a main component can be used.

(Addition Step)

In the addition step, a compound (1) represented by the aforementioned general formula (1) is added to the metal chalcogenide nano particles, thereby obtaining a metal chalcogenide dispersion.

In general formula (1), $R^1$ to $R^4$ each independently represents an alkyl group, an aryl group or a hydrogen atom, provided that at least one of $R^1$ to $R^4$ represents an alkyl group or an aryl group.

The alkyl group for $R^1$ to $R^4$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, a methyl group or an ethyl group is more preferable, and a methyl group is most preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

The cyclic alkyl group preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The aryl group for $R^1$ to $R^4$ preferably has 4 to 20 carbon atoms, more preferably 4 to 10 carbon atoms, and most preferably 6 to 10 carbon atoms. Specific examples include a phenyl group, a biphenyl group, a fluorenyl group, a naphthyl group, an anthryl group and a phenanthryl group.

In general formula (1), when $R^1$ and $R^2$ each independently represents an alkyl group or an aryl group, $R^1$ and $R^2$ may be mutually bonded to form a ring with the nitrogen atom; and when $R^3$ and $R^4$ each independently represents an alkyl group or an aryl group, $R^3$ and $R^4$ may be mutually bonded to form a ring with the nitrogen atom. In the case where $R^1$ and $R^2$ (or $R^3$ and $R^4$) are mutually bonded to form a ring with the nitrogen atom, it is preferable that a 3 to 10-membered ring including the nitrogen atom is formed, and it is most preferable that a 5 to 7-membered ring including the nitrogen atom is formed.

In general formula (1), in view of the solubility in the solvent containing water as a main component, it is preferable that $R^1$ to $R^4$ each independently represents an alkyl group, and more preferably a linear alkyl group of 1 to 5 carbon atoms.

Specific examples of the compound (1) include 1,1,2-trimethylguanidine, 1-octylguanidine, 1-butylguanidine, 1,3-dibenzylguanidine, 1,2,3-tribenzylguanidine, N-methyl-N'-phenylguanidine, 1,1,2,3-tetramethylguanidine, 1,3-dibutylguanidine, 1,1-diphenylguanidine, 1-phenylguanidine, 1,1,3,3-tetramethylguanidine, 1,1,3,3-tetraethylguanidine, 1,1,3,3-tetra(n-propyl)guanidine, 1,1,3,3-tetra(isopropyl)guanidine, 1,1,3,3-tetra(n-butyl)guanidine, 1,1,3,3-tetra(n-hexyl)guanidine, 1,1,3,3-tetra(1-octyl)guanidine, 1,1,3,3-tetra(n-decyl)guanidine, 1,1,3,3-tetraphenylguanidine and 1,1,3,3-tetrabenzylguanidine.

The amount of the compound (1) added is not particularly limited. The amount of the compound (1) added, per 1 mol of the at least one metal or metal compound is preferably 0.1 to 3 mol, more preferably 0.1 to 1.5 mol, and most preferably 0.3 to 1.0 mol.

With respect to a metal chalcogenide dispersion obtained by the production method according to the present invention, a percentage of change in an initial viscosity is preferably within ±10%, more preferably within ±5%, and most preferably within ±3%.

When the percentage of change in the initial viscosity of the metal chalcogenide dispersion is within the above-mentioned range, an excellent film thickness stability can be obtained in the case where a film is formed using the metal chalcogenide dispersion.

In the present invention, the percentage of change in the initial viscosity of the metal chalcogenide dispersion can be determined, for example, by measuring the viscosity of the metal chalcogenide dispersion immediately after the production thereof and the viscosity after a predetermined period using a viscometer, and calculated from the following formula:

Change in viscosity=[(viscosity immediately after production)−(viscosity after predetermined period)]

Percentage of change in initial viscosity={[(Change in viscosity)/(viscosity immediately after production)]×100}

The predetermined period is preferably 1 week or more, and more preferably 1 month or more.

With respect to a metal chalcogenide dispersion obtained by the production method according to the present invention, the average particle diameter of the metal chalcogenide nano particles obtained after the addition step is preferably 100 nm or less. When the average particle diameter of the metal chalcogenide nano particles obtained after the addition step is within the above-mentioned range, a uniform coating film can be formed.

The lower limit of the average particle diameter of the metal chalcogenide nano particles obtained after the addition step is not particularly limited, however, in practice, the average particle diameter is preferably 20 nm or more.

The metal chalcogenide dispersion obtained by the production method according to the present invention can be directly used in the formation of a light-absorbing layer. Alternatively, the metal chalcogenide dispersion may be further subjected to a washing treatment, a dispersion treatment, a separation treatment or the like, and then used as a coating solution for forming a light-absorbing layer.

It is also preferable to add Na to the metal chalcogenide dispersion obtained by the production method according to the present invention. By adding Na, the crystal growth of the light-absorbing layer can be promoted. Alternatively, Na may be dissolved in a solvent. As the Na solution, an aqueous solution of an aqueous Na compound can be used, such as NaF, NaCl, NaBr, NaI, $Na_2CO_3$, $NaHCO_3$ or a sodium salt of an organic acid.

For example, in the case where the coating solution is used for forming a light-absorbing layer of a CZTS solar cell, the amount of Na added is preferably from 0.1 to 10 atm %, more preferably from 0.1 to 2 atm %, based on the molar amount of the CZTS metals.

Alternatively, for example, in the case where the coating solution is used for forming a light-absorbing layer of a CIGS solar cell, the amount of Na added is preferably from 0.1 to 10 atm %, more preferably from 0.1 to 2 atm %, based on the molar amount of the CIGS metals.

It is also preferable to add Sb to the metal chalcogenide dispersion obtained by the production method according to the present invention.

For example, in the case where the coating solution is used for forming a light-absorbing layer of a CZTS solar cell, the amount of Sb added is preferably from 0.1 to 2 atm %, more preferably from 0.1 to 0.5 atm %, based on the molar amount of the CZTS metals.

Alternatively, for example, in the case where the coating solution is used for forming a light-absorbing layer of a CIGS solar cell, the amount of Sb added is preferably from 0.1 to 2 atm %, more preferably from 0.1 to 0.5 atm %, based on the molar amount of the CIGS metals.

By virtue of the production method of a metal chalcogenide dispersion according to the first aspect of the present invention, a metal chalcogenide dispersion having a small average particle diameter and small change in the viscosity with lapse of time can be obtained. Therefore, in the case where a film is formed using the metal chalcogenide dispersion, an excellent film thickness stability can be obtained.

In a metal chalcogenide dispersion obtained by a conventional method, metal chalcogenide particles agglomerate with lapse of time, and hence, a dispersion treatment was required again, thereby posing a problem in terms of forming a uniform coating film. In contrast, in a metal chalcogenide dispersion obtained by the production method according to the present invention, since agglemeration of particles with lapse of time is suppressed, no precipitation of metal chalcogenide particles occur after storing for a certain period, and hence, a uniform coating film can be formed.

[Metal Chalcogenide Dispersion]

A second aspect of the present invention is a metal chalcogenide dispersion usable in forming a light absorbing layer of a solar cell, including: metal chalcogenide particles of at least one metal or metal compound selected from the group consisting of a group 11 metal, a group 12 metal, a group 13 metal, a group 14 metal, a group 15 metal, a group 11 metal compound, a group 12 metal compound, a group 13 metal compound, a group 14 metal compound and a group 15 metal compound; a solvent containing water as a main component; and a compound (1) represented by the aforementioned general formula (1).

In the metal chalcogenide dispersion according to the present invention, the at least one metal or metal compound, the solvent containing water as a main component, and the compound (1) are the same as defined for the at least one metal or metal compound, the solvent containing water as a main component, and the compound (1) in the first aspect, respectively.

The amount of the compound (1) is not particularly limited. The amount of the compound (1) added, per 1 mol of the at least one metal or metal compound is preferably 0.1 to 3 mol, more preferably 0.1 to 1.5 mol, and most preferably 0.3 to 1.0 mol.

With respect to the metal chalcogenide dispersion of the present invention, a percentage of change in an initial viscosity is preferably within ±10%, more preferably within ±5%, and most preferably within ±3%. When the percentage of change in the initial viscosity of the metal chalcogenide dispersion is within the above-mentioned range, an excellent film thickness stability can be obtained in the case where a film is formed using the metal chalcogenide dispersion.

With respect to the metal chalcogenide dispersion of the present invention, the average particle diameter of the metal chalcogenide nano particles is preferably 100 nm or less. When the average particle diameter of the metal chalcogenide nano particles is within the above-mentioned range, a uniform coating film can be formed.

The lower limit of the average particle diameter of the metal chalcogenide nano particles is not particularly limited, however, in practice, the average particle diameter is preferably 20 nm or more.

The metal chalcogenide dispersion of the present invention can be directly used in the formation of a light-absorbing layer. Alternatively, the metal chalcogenide dispersion may be further subjected to a washing treatment, a dispersion treatment, a separation treatment or the like, and then used as a coating solution for forming a light-absorbing layer.

It is also preferable to add Na to the metal chalcogenide dispersion of the present invention. It is also preferable to add Sb to the metal chalcogenide dispersion of the present invention. The amounts of Na and Sb are the same as defined in the first aspect.

The metal chalcogenide dispersion according to the present invention exhibits the same effects as the metal chalcogenide dispersion obtained by the production method according to the first aspect of the present invention.

[Production Method of Light-Absorbing Layer for Solar Cell]

A third aspect of the present invention is a method of forming a light absorbing layer of a solar cell, the method including: applying a metal chalcogenide dispersion obtained by the method according to the first aspect to a base, followed by baking.

The method of forming a light absorbing layer of a solar cell according to the present invention is the same as the step of forming a light absorbing layer in the method of forming a solar cell according to a fourth aspect of the present invention.

[Production Method of a Solar Cell]

A fourth aspect of the present invention is a method of producing a solar cell, the method including: forming a first electrode on a substrate; applying a metal chalcogenide dispersion obtained by the method according to the first aspect to the first electrode, followed by baking to form a light absorbing layer; forming a buffer layer on the light absorbing layer; and forming a second electrode on the buffer layer.

In the method of forming a solar cell according to the present invention, the steps other than the step of forming a light-absorbing layer on the first electrode can be performed by any conventional method. For example, the step of forming a first electrode on a substrate can be performed by a sputtering method using nitrogen as a sputtering gas, and forming a film layer such as an Mo layer. The buffer layer can be formed as a CdS layer by, for example, a chemical bath deposition method. The second electrode can be formed as a transparent electrode using an appropriate material.

In the formation of a light-absorbing layer, firstly, a metal chalcogenide dispersion obtained by the production method according to the first aspect is applied to the first electrode (base). The application of the coating solution can be conducted by a spin-coat method, a dip-coat method, a doctor-blade (applicator) method, a curtain-slit cast method, a printing method, a spraying method or the like.

The application conditions can be appropriately selected depending on the desired film thickness, concentration of the materials and the like.

For example, in a spin-coating method, the base is set on a spin coater, followed by applying the coating solution to the base. The application conditions can be appropriately selected depending on the film thickness. For example, the application can be performed at a rotation speed of 300 to 3,000 rpm for 10 to 180 seconds. The application can be repeatedly performed until a desired thickness is obtained.

In a dipping method, the base can be dipped in a container containing the coating solution. The dipping can be performed once, or a plurality of times.

After applying the coating solution for forming a light absorbing layer on the base, a vacuum drying may be performed.

Subsequently, after applying the coating solution on the support, the support is baked to form a light-absorbing layer.

The baking conditions can be appropriately selected depending on the desired film thickness, the type of materials used, and the like. For example, the baking can be performed in 2 steps, namely, performing a soft bake on a hot plate (prebake), followed by baking in an oven (annealing).

In such a case, for example, the support may be set and held on a hot plate, followed by raising the temperature of the hot plate to 100 to 500° C. to perform the soft bake for 1 to 30 seconds. Then, the hot plate is cooled to room temperature, and application is performed again. After obtaining the desired film thickness, the hot plate or the inside of the oven is heated to 300 to 700° C. and maintained for 1 to 180 minutes to perform the annealing.

As a result, the light-absorbing layer is cured.

The baking temperatures described above are merely one example of the baking conditions, and the baking conditions are not particularly limited. For example, the temperature of the hot plate can be raised in a stepwise manner, and the heating may be performed in an inert gas atmosphere in a glove box. Further, soft bake or anneal may be performed in an atmosphere in the presence of hydrogen sulfide, hydrogen selenide, solid sulfur or solid selenium.

In this manner, a solar cell according to the present embodiment can be produced. In the solar cell produced by the production method according to this embodiment, the metal chalcogenide dispersion used in the formation of the light absorbing layer has a small average particle diameter and small change in the viscosity with lapse of time. Therefore, it is expected that a high production stability, a high uniformity of the light absorbing layer and excellent solar cell properties can be obtained.

EXAMPLES

As follows is a description of examples of the present invention, although the scope of the present invention is by no way limited by these examples.

Example 1

0.43 g of $CuCl_2$, 0.24 g of $ZnCl_2$, 0.46 g of $SnCl_4$ and 10 ml of a 20% aqueous solution of ammonium sulfide (($NH_4)_2S$) were mixed together and stirred, so as to precipitate sulfides of Cu, Zn and Sn, thereby obtaining a precipitation liquid.

Then, the obtained precipitation liquid was subjected to a dispersion treatment for 2 hours using ultrasonic wave. Thereafter, a centrifugal separation was conducted, and a supernatant was removed, so as to remove impurities.

The CZTS particles separated by the centrifugal separation were diluted with 25 ml of water, and 0.78 g of 1,1,3,3-tetramethylguanidine was added thereto. Then, a dispersion treatment was conducted using ultrasonic wave, thereby obtaining a CZTS nano particle dispersion.

Comparative Example 1

A CZTS nano particle dispersion was obtained in the same manner as in Example 1, except that 1,1,3,3-tetramethylguanidine was not added.

Comparative Example 2

A CZTS nano particle dispersion was obtained in the same manner as in Example 1, except that 0.30 g of formamide was added instead of 1,1,3,3-tetramethylguanidine.

Comparative Example 3

A CZTS nano particle dispersion was obtained in the same manner as in Example 1, except that 0.49 g of N-methylacetamide was added instead of 1,1,3,3-tetramethylguanidine.

Comparative Example 4

A CZTS nano particle dispersion was obtained in the same manner as in Example 1, except that 0.50 g of thioacetamide was added instead of 1,1,3,3-tetramethylguanidine.

Comparative Example 5

A CZTS nano particle dispersion was obtained in the same manner as in Example 1, except that 0.41 g of urea was added instead of 1,1,3,3-tetramethylguanidine.

Comparative Example 6

A CZTS nano particle dispersion was obtained in the same manner as in Example 1, except that 0.72 g of thiolactic acid was added instead of 1,1,3,3-tetramethylguanidine.

Comparative Example 7

A CZTS nano particle dispersion was obtained in the same manner as in Example 1, except that 0.78 g of tetramethylurea was added instead of 1,1,3,3-tetramethylguanidine.

Comparative Example 8

A CZTS nano particle dispersion was obtained in the same manner as in Example 1, except that 0.89 g of tetramethylthiourea was added instead of 1,1,3,3-tetramethylguanidine.

Comparative Example 9

A CZTS nano particle dispersion was obtained in the same manner as in Example 1, except that 0.80 g of guanidine thiocyanate was added instead of 1,1,3,3-tetramethylguanidine.

[Particle Size Distribution]

With respect to the CZTS nano particle dispersions obtained in Example 1 and Comparative Examples 1 to 9, the average particle diameter (nm) immediately after production was measured using a dynamic light scattering particle size distribution analyzer LB-550 (manufactured by Horiba, Ltd.). The results are shown in Table 1.

Further, with respect to the CZTS nano particle dispersions obtained in Example 1 and Comparative Example 1, the average particle diameter after 1 month and the average particle diameter after 1 month and conducting ultrasonic treatment were measured in the same manner. The results are shown in Table 1.

[Viscosity]

With respect to the CZTS nano particle dispersions obtained in Example 1 and Comparative Examples 1 to 9, the viscosity (cP) at 25° C. was measured using a sine-wave vibro viscometer SV-10 (manufactured by A & D Company, Ltd.). With respect to the CZTS nano particle dispersions obtained in Example 1 and Comparative Example 1, the viscosity immediately after the production thereof and the viscosity after 1 month were measured. With respect to the CZTS nano particle dispersions obtained in Comparatives Example 2 to 9, the viscosity immediately after the production thereof and the viscosity after 1 week were measured.

From the measured viscosity, the amount of change in the viscosity [(viscosity immediately after the production thereof)−(the viscosity after 1 month or 1 week)] and the percentage of the change in the viscosity {[(amount of change in the viscosity)/(viscosity immediately after production thereof)]×100} were determined.

The results are shown in Table 1.

[Evaluation of Precipitation]

With respect to the CZTS nano particle dispersions obtained in Example 1 and Comparative Example 1, occurrence of precipitation after being allowed to stand for 1 month was visually observed. With respect to the CZTS nano particle dispersions obtained in Comparative Examples 2 to 9, occurrence of precipitation after being allowed to stand for 1 week was visually observed. The results are shown in Table 1.

TABLE 1

| | | Average particle diameter [nm] | | | Viscosity [cP] | | | | | Precipitation with time |
|---|---|---|---|---|---|---|---|---|---|---|
| | Additive | Immediately after production | After 1 month | After ultrasonic treatment | Immediately after production | After 1 week | After 1 month | Amount of change | Percentage of change (%) | |
| Ex. 1 | 1,1,3,3-tetramethyl-guanidine | 63 | 60 | 60 | 1.64 | — | 1.62 | −0.02 | −1.2 | None |
| Comp. Ex. 1 | None | 213 | 1874 | 920 | 1.78 | — | 3.27 | 1.49 | 83.7 | Observed |
| Comp. Ex. 2 | formamide | 201 | — | — | 1.59 | 3.26 | — | 1.67 | 105 | Observed |
| Comp. Ex. 3 | N-methylacetamide | 212 | — | — | 2.15 | 3.15 | — | 1 | 46.5 | Observed |
| Comp. Ex. 4 | thioacetamide | 183 | — | — | 2.18 | 2.23 | — | 0.05 | 2.3 | Observed |
| Comp. Ex. 5 | urea | 192 | — | — | 1.58 | 2.68 | — | 1.1 | 69.6 | Observed |
| Comp. Ex. 6 | thiolactic acid | 1406 | — | — | 7.45 | 8.75 | — | 1.3 | 17.4 | Observed |
| Comp. Ex. 7 | tetramethylurea | 441 | — | — | 1.62 | 2.92 | — | 1.3 | 80.2 | Observed |
| Comp. Ex. 8 | tetramethylthiourea | 299 | — | — | 2.65 | 3.07 | — | 0.42 | 15.8 | Observed |
| Comp. Ex. 9 | guanidine thiocyanate | 2902 | — | — | 1.97 | 3.43 | — | 1.46 | 74.1 | Observed |

As seen from the results shown in Table 1, with respect to the CZTS nano particle dispersion of Example 1, the average particle diameter was suppressed to 100 nm or less, the change in the viscosity after being allowed to stand for 1 month was extremely small, and no precipitation was observed. Further, after being allowed to stand for 1 month, the average particle diameter hardly changed, and was suppressed to no more than 100 nm.

On the other hand, with respect to the CZTS nano particle dispersion of Comparative Example 1, the average particle diameter was large as compared to the CZTS nano particle dispersion of Example 1. Further, the viscosity was increased after being allowed to stand for 1 month, and precipitation was observed. Further, after being allowed to stand for 1 month, the average particle diameter had markedly increased, such that the average particle diameter could not be satisfactorily reduced even by an ultrasonic treatment.

With respect to the CZTS nano particle dispersions of Comparative Examples 2 to 9, the average particle diameter was large as compared to the CZTS nano particle dispersion of Example 1. Further, with respect to the CZTS nano particle dispersions of Comparative Examples 2, 3 and 5 to 9, the viscosity was increased only after being allowed to stand for 1 week. Furthermore, with respect to the CZTS nano particle dispersions of Comparative Examples 2 to 9, precipitation was observed after being allowed to stand for 1 week.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a metal chalcogenide dispersion usable in forming a light absorbing layer of a solar cell, the method comprising:
   a metal chalcogenide nano particle formation step in which at least one metal or metal compound selected from the group consisting of a group 11 metal, a group 12 metal, a group 13 metal, a group 14 metal, a group 15 metal, a group 11 metal compound, a group 12 metal compound, a group 13 metal compound, a group 14 metal compound and a group 15 metal compound, a solvent containing water as a main component, and a group 16 element-containing compound are mixed together to obtain metal chalcogenide nano particles; and
   an addition step in which a compound (1) represented by general formula (1) shown below is added to the metal chalcogenide nano particles, thereby obtaining a metal chalcogenide dispersion:

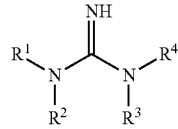

(1)

wherein $R^1$ to $R^4$ each independently represents an alkyl group, an aryl group or a hydrogen atom; provided that at least one of $R^1$ to $R^4$ represents an alkyl group or an aryl group; when $R^1$ and $R^2$ each independently represents an alkyl group or an aryl group, $R^1$ and $R^2$ may be mutually bonded to form a ring with the nitrogen atom; and when $R^3$ and $R^4$ each independently represents an alkyl group or an aryl group, $R^3$ and $R^4$ may be mutually bonded to form a ring with the nitrogen atom.

2. The method according to claim 1, wherein $R^1$ to $R^4$ in general formula (1) each independently represents an alkyl group.

3. The method according to claim 1, wherein $R^1$ to $R^4$ in general formula (1) each independently represents a linear alkyl group of 1 to 5 carbon atoms.

4. The method according to claim 1, wherein 0.1 to 3 mol of the compound (1) is added, per 1 mol of the at least one metal or metal compound.

5. The method according to claim 1, wherein the metal chalcogenide nano particle formation step comprises subjecting the metal chalcogenide nano particles to a dispersion treatment.

6. The method according to claim 5, wherein the dispersion treatment is an ultrasonic wave treatment.

7. The method according to claim 5, which comprises separating the metal chalcogenide nano particles which has been subjected to the dispersion treatment.

8. The method according to claim 7, which further comprises mixing the separated metal chalcogenide nano particles with a solvent.

9. The method according to claim 7, which further comprises mixing the separated metal chalcogenide nano particles with a solvent, followed by conducting a dispersion treatment.

10. The method according to claim 1, wherein the solvent further comprises at least one organic solvent selected from the group consisting of methanol, ethanol, propanol, dimethylsulfoxide and N,N-dimethylacetamide.

11. The method according to claim 1, wherein percentage of change in an initial viscosity of the metal chalcogenide dispersion is within ±10%.

12. A metal chalcogenide dispersion usable in forming a light absorbing layer of a solar cell, comprising:
   metal chalcogenide nano particles of at least one metal or metal compound selected from the group consisting of a group 11 metal, a group 12 metal, a group 13 metal, a group 14 metal, a group 15 metal, a group 11 metal compound, a group 12 metal compound, a group 13 metal compound, a group 14 metal compound and a group 15 metal compound;
   a solvent containing water as a main component; and
   a compound (1) represented by general formula (1) shown below:

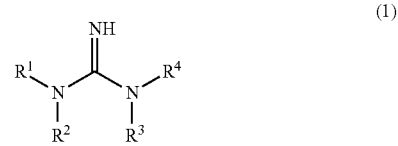

(1)

wherein $R^1$ to $R^4$ each independently represents an alkyl group, an aryl group or a hydrogen atom; provided that at least one of $R^1$ to $R^4$ represents a hydrocarbon group; when $R^1$ and $R^2$ each independently represents an alkyl group or an aryl group, $R^1$ and $R^2$ may be mutually bonded to form a ring with the nitrogen atom; and when $R^3$ and $R^4$ each independently represents an alkyl group or an aryl group, $R^3$ and $R^4$ may be mutually bonded to form a ring with the nitrogen atom.

13. The metal chalcogenide dispersion according to claim 12, wherein $R^1$ to $R^4$ in general formula (1) each independently represents an alkyl group.

14. The metal chalcogenide dispersion according to claim 12, wherein $R^1$ to $R^4$ in general formula (1) each independently represents a linear alkyl group of 1 to 5 carbon atoms.

15. The metal chalcogenide dispersion according to claim 12, wherein the amount of the compound (1) is 0.1 to 3 mol, per 1 mol of the at least one metal or metal compound.

16. The metal chalcogenide dispersion according to claim 12, wherein the solvent further comprises at least one organic solvent selected from the group consisting of methanol, ethanol, propanol, dimethylsulfoxide and N,N-dimethylacetamide.

17. The metal chalcogenide dispersion according to claim 12, wherein percentage of change in an initial viscosity is within ±10%.

18. A method of forming a light absorbing layer of a solar cell, the method comprising:
applying a metal chalcogenide dispersion obtained by the method according to claim 1 to a base, followed by baking.

19. A method of producing a solar cell, the method comprising:
forming a first electrode on a substrate;
applying a metal chalcogenide dispersion obtained by the method according to claim 1 to the first electrode, followed by baking to form a light absorbing layer;
forming a buffer layer on the light absorbing layer; and
forming a second electrode on the buffer layer.

* * * * *